(12) United States Patent
Ki et al.

(10) Patent No.: US 9,343,028 B2
(45) Date of Patent: May 17, 2016

(54) METHOD OF DRIVING A GATE LINE, GATE DRIVE CIRCUIT AND DISPLAY APPARATUS HAVING THE GATE DRIVE CIRCUIT

(75) Inventors: Dong-Hyeon Ki, Cheonan-si (KR); Ho-Kyoon Kwon, Seoul (KR); Ju-Hee Lee, Cheonan-si (KR); Byoung-Sun Na, Hwaseong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 1347 days.

(21) Appl. No.: 12/423,995

(22) Filed: Apr. 15, 2009

(65) Prior Publication Data

US 2010/0134399 A1 Jun. 3, 2010

(30) Foreign Application Priority Data

Nov. 28, 2008 (KR) .................. 10-2008-0120156

(51) Int. Cl.
  *G09G 3/36* (2006.01)
  *G11C 19/18* (2006.01)
  *G11C 19/28* (2006.01)

(52) U.S. Cl.
  CPC ............ *G09G 3/3677* (2013.01); *G11C 19/184* (2013.01); *G11C 19/28* (2013.01); *G09G 2310/0286* (2013.01)

(58) Field of Classification Search
  CPC .................................................. G09G 3/3677
  USPC ........ 345/94, 92, 100, 211; 324/536; 713/500
  See application file for complete search history.

(56) References Cited

U.S. PATENT DOCUMENTS

| 7,463,037 | B2 * | 12/2008 | Henson et al. ................ 324/536 |
| 7,633,477 | B2 * | 12/2009 | Jang et al. ........................ 345/92 |
| 7,639,226 | B2 * | 12/2009 | Kim et al. ...................... 345/100 |
| 7,685,457 | B2 * | 3/2010 | Jacobson et al. .............. 713/500 |
| 2006/0145998 | A1 * | 7/2006 | Cho et al. ....................... 345/100 |
| 2009/0040161 | A1 * | 2/2009 | Baek et al. ....................... 345/94 |

FOREIGN PATENT DOCUMENTS

| JP | 2008217902 A | 9/2008 |
| KR | 1020050113777 A | 12/2005 |
| KR | 1020060078504 A | 7/2006 |
| KR | 1020070017600 A | 2/2007 |
| KR | 1020070095585 A | 10/2007 |
| KR | 1020070121071 A | 12/2007 |
| KR | 1020080000205 A | 1/2008 |
| KR | 1020080033565 A | 4/2008 |

* cited by examiner

*Primary Examiner* — Fred Tzeng
(74) *Attorney, Agent, or Firm* — Cantor Colburn LLP

(57) ABSTRACT

A method of driving a gate line includes: charging one of a scan start signal and a carry signal provided from a previous stage to a first node of a present stage; outputting a gate signal through a gate node of the present stage by pulling up a high level of a first clock signal at the first node to boost up a voltage potential of the first node; discharging the voltage potential of the first node and a voltage potential of the gate node to hold the first node and the gate node at a first power voltage as the first clock signal is shifted to a low level; and receiving a voltage potential signal of a second node of the previous stage, the second node holding a gate signal outputted from the previous stage, to reduce a ripple generated at the first node.

12 Claims, 13 Drawing Sheets

(b)

(a)

METHOD OF DRIVING A GATE LINE, GATE DRIVE CIRCUIT AND DISPLAY APPARATUS HAVING THE GATE DRIVE CIRCUIT

This application claims priority to Korean Patent Application No. 2008-120156, filed on Nov. 28, 2008, and all the benefits accruing therefrom under 35 U.S.C. §119, the contents of which in its entirety are herein incorporated by reference.

BACKGROUND OF THE INVENTION

1. Field of the Invention

The present invention relates to a method of driving a gate line, a gate drive circuit and a display apparatus having the gate drive circuit. More particularly, the present invention relates to a method of driving a gate line in which reliability of an operation thereof is substantially enhanced, a gate drive circuit performing the method and a display apparatus having the gate drive circuit.

2. Description of the Related Art

Generally, a liquid crystal display ("LCD") apparatus includes an LCD panel which displays images by controlling a light-transmitting ratio of liquid crystal molecules provided with light from a backlight assembly disposed below the LCD panel.

The LCD apparatus typically includes a display panel, a gate driving part and a data driving part. The display panel includes gate lines, data lines and pixel parts electrically connected to the gate lines and the data lines. The gate driving part outputs gate signals to the gate lines. The data driving part outputs data signals to the data lines. The gate driving part and the data driving part may be formed in a chip mounted on the display panel.

In efforts to decrease a size of the LCD apparatus and to improve manufacturing productivity of the LCD apparatus, the gate driving part has been integrated on a display substrate such as an amorphous silicon gate ("ASG") type substrate. However, when a gate drive circuit integrated on the display substrate is driven at a high temperature, noise from an abnormal gate on signal is generated during a gate off signal interval is generated.

In addition, properties of an amorphous silicon thin-film transistor ("a-Si TFT") of the gate drive circuit vary with changes in temperature and over time.

As a result, a gate bias stress applied to a TFT in the gate drive circuit generates a threshold voltage shift when the gate drive circuit is driven. The threshold voltage shift substantially reduces a current driving ability of a hold transistor which is included in the gate drive circuit to maintain an off level of a gate line and a gate terminal of a pull-up transistor which outputs a gate signal.

BRIEF SUMMARY OF THE INVENTION

Exemplary embodiments of the present invention provide a method of driving a gate line having substantially enhanced reliability of an operation thereof.

Exemplary embodiments of the present invention also provide a gate drive circuit for performing the method.

Exemplary embodiments of the present invention also provide a display apparatus having the gate drive circuit.

According to an exemplary embodiment of the present invention, a method of driving a gate line includes: charging one of a scan start signal and a carry signal provided from a previous stage to a first node of a present stage; outputting a gate signal through a gate node of the present stage by pulling-up a high level of a first clock signal at the first node to boost up a voltage potential of the first node; discharging the voltage potential of the first node and a voltage potential of the gate node to hold the first node and the gate node at a first power voltage as the first clock signal is shifted to a low level; and receiving a voltage potential signal of a second node of the previous stage, the second node holding a gate signal outputted from the previous stage, to reduce a ripple generated at the first node.

In an exemplary embodiment of the present invention, the voltage potential of the second node of the previous stage is synchronized with a second clock signal having a phase which is substantially inverted from a phase the first clock signal.

In an exemplary embodiment of the present invention, when the present stage is an n-th stage (where "n" is a natural number), the previous stage is an (n−1)-th stage.

In an alternative exemplary embodiment of the present invention, when the present stage is an n-th stage, the previous stage is an (n−2)-th stage.

In another alternative exemplary embodiment of the present invention, when the present stage is an n-th stage, the previous stage is an (n−3)-th stage.

According to an alternative exemplary embodiment of the present invention, a gate drive circuit includes cascaded stages, the cascaded stages including a first stage to which a scan start signal is provided to an input terminal thereof. Each stage of the cascaded stages includes: a charging section which charges one of the scan start signal and a carry signal provided from a previous stage to a first node; a driving section connected to the charging section at the first node, the driving section configured to pull up a high level of a first clock signal to output a gate signal through a gate node as the first node is charged to a high level; a first discharging section which discharges a voltage potential of the first node and a voltage potential of the gate node to hold the voltage potential of the first node and the voltage potential of the gate node at a first power voltage as the first clock signal is shifted to a low level; and a second discharging section which receives a voltage potential signal of a second node of a previous stage, which holds a gate signal outputted from the previous stage, to reduce ripples generated at the first node.

In an exemplary embodiment of the present invention, the second discharging section may include a ripple-restraining transistor including a drain connected to the first power voltage, a source connected to the first node and a gate connected to the second node of the previous stage. The gate of the ripple-restraining transistor may maintain the first power voltage during a charging time of the first node to reduce ripples generated at the first node.

In an exemplary embodiment of the present invention, when the second discharging section is an n-th stage, the previous stage may be an (n−1)-th stage.

In an alternative exemplary embodiment of the present invention, when the second discharging section is in an n-th stage, the previous stage may be an (n−2)-th stage.

In another alternative exemplary embodiment of the present invention, when the second discharging section is in an n-th stage, the previous stage may be an (n−3)-th stage.

The gate drive circuit may further include a first clock signal line which transmits the first clock signal and a second clock signal line which transmits a second clock signal having a phase which is substantially inverted from a phase of the first clock signal.

The gate drive circuit may further include a third clock signal line which transmits a third clock signal and a fourth clock signal line which transmits a fourth clock signal having a phase which is substantially inverted from a phase of the third clock signal.

The gate drive circuit may further include a fifth clock signal line which transmits a fifth clock signal and a sixth clock signal line which transmits a sixth clock signal having a phase which is substantially inverted from a phase of the fifth clock signal.

According to another alternative exemplary embodiment of the present invention, a display apparatus includes a display panel, a data drive circuit and a gate drive circuit. The display panel includes pixel parts connected to gate lines and data lines crossing the gate lines. The data drive circuit provides the data lines with a data voltage. The gate drive includes cascaded stages. Each of the cascaded stages includes a charging section, a driving section, a first discharging section and a second discharging section. The charging section charges a scan start signal or a carry signal provided from a previous stage to a first node. The driving section is connected to the charging section through the first node. The driving section pulls up a high level of a first clock signal to output a gate signal through a gate node as the first node is charged to a high level. The first discharging section discharges a voltage potential of the first node and a voltage potential of the gate node to hold the voltage potential of the first node and the voltage potential of the gate node to a first power voltage as the first clock signal is shifted to a low level. The second discharging section receives a voltage potential signal of a second node of a previous stage, which holds a gate signal outputted from the previous stage, to reduce ripple components generated at the first node.

In an exemplary embodiment of the present invention, the second discharging section may include a ripple-restraining transistor including a drain connected to the first power voltage, a source connected to the first node, and a gate connected to the second node of the previous stage.

In an exemplary embodiment of the present invention, when the second discharging section is in an n-th stage, the previous stage may be an (n−1)-th stage. The gate drive circuit may further include a first clock signal line which transmits the first clock signal and a second clock signal line which transmits a second clock signal having a phase which is substantially inverted from a phase of the first clock signal.

In an exemplary embodiment of the present invention, when the second discharging section is in an n-th stage, the previous stage may be an (n−2)-th stage, and the gate drive circuit may further include a first clock signal line which transmits the first clock signal, a second clock signal line which transmits a second clock signal having a phase which is substantially inverted phase from a phase of the first clock signal, a third clock signal line which transmits a third clock signal, and a fourth clock signal line which transmits a fourth clock signal having a phase which is substantially inverted from a phase of the third clock signal.

In an exemplary embodiment of the present invention, when the second discharging section is in an n-th stage, the previous stage may be an (n−3)-th stage, and the gate drive circuit may further include a first clock signal line which transmits the first clock signal, a second clock signal line transmitting a second clock signal having a phase which is substantially inverted from a phase of the first clock signal, a third clock signal line which transmits a third clock signal, a fourth clock signal line transmitting a fourth clock signal having a phase which is substantially inverted from a phase of the third clock signal, a fifth clock signal line which transmits a fifth clock signal, and a sixth clock signal line which transmits a sixth clock signal having a phase which is substantially inverted from a phase of the fifth clock signal.

Thus, in a method of driving a gate line, a gate drive circuit and a display apparatus having the gate drive circuit according to exemplary embodiments of the present invention, a gate of a transistor which discharges a first node at a present stage is connected to an output of a second node which is outputted from a previous stage to hold a gate signal. As a result ripples are effectively prevented from being generated during an interval period during which the gate signal is held at a first power voltage, and a reliability of an operation of the gate drive circuit which outputs a gate signal is substantially enhanced.

BRIEF DESCRIPTION OF THE DRAWINGS

The above and other aspects, features and advantages of the present invention will become more readily apparent by describing in further detail exemplary embodiments thereof with reference to the accompanying drawings, in which.

DETAILED DESCRIPTION OF THE INVENTION

Figure 1:
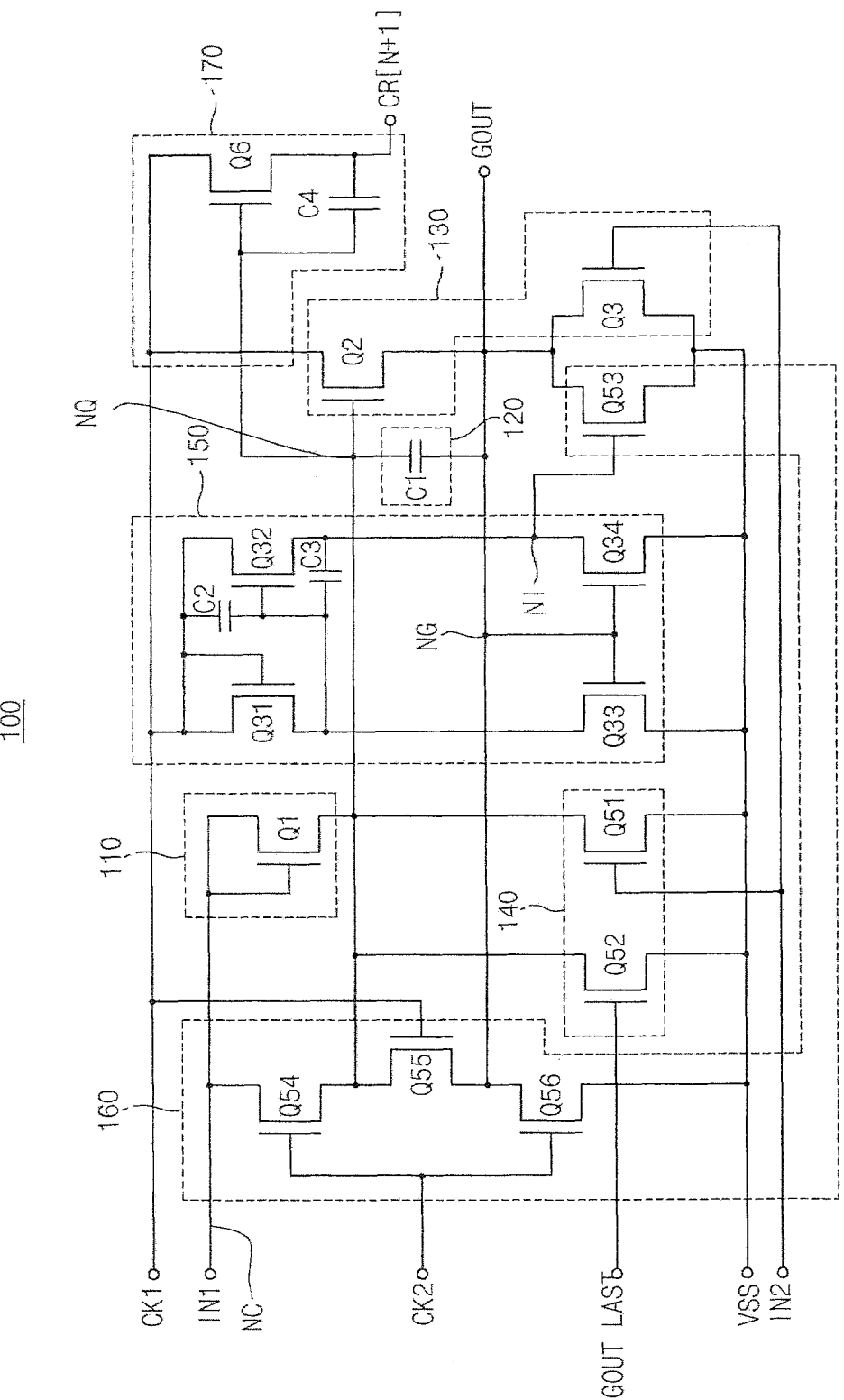
FIG. 1 is a schematic circuit diagram of an exemplary embodiment of a unit stage of a gate drive circuit according to the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, exemplary embodiments of the present invention will be described in further detail with reference to the accompanying drawings.

FIG. 1 is a schematic circuit diagram of an exemplary embodiment of a unit stage of a gate drive circuit according to the present invention.

Referring to FIG. 1, a unit stage 100 of a gate drive circuit according to an exemplary embodiment of the present invention includes a buffer section 110, a charging section 120, a driving section 130, a discharging section 140, a first holding section 150, a second holding section 160 and a carry section 170. The unit stage 100 of a gate drive circuit outputs a scan signal (e.g., a gate signal) in response to a scan start signal STV (FIG. 11) or a carry signal outputted from a previous stage, such as an (N−1)-th stage, and (N−2)-th stage or an (N−3)-th stage, for example.

The buffer section 110 provides the charging section 120, the driving section 130, the discharging section 140 and the second holding section 160 with the carry signal provided from a previous stage. The carry signal is a first input signal IN1. When the unit stage 100 is the first stage of a plurality of cascaded stages, the first input signal IN1 is the scan start signal STV inputted to the first stage.

The charging section 120 includes a capacitor C1. A first terminal of the capacitor C1 is electrically connected to a source of transistor Q1 and the discharging section 140. A second terminal of the capacitor C1 is electrically connected to an output terminal GOUT of the driving section 130.

The driving section 130 includes a transistor Q2 and a transistor Q3. A drain of the transistor Q2 is electrically connected to a first clock terminal CK1, and a gate of the transistor Q2 is electrically connected to the first terminal of the capacitor C1. A source of the transistor Q2 is electrically connected to the second terminal of the capacitor C1 and the output terminal GOUT. A drain of the transistor Q3 is electrically connected to the source of the transistor Q2 and the second terminal of the capacitor C1, and a source of the transistor Q3 is electrically connected to a first power voltage VSS. When the unit stage 100 of the shift register is an even-numbered stage, a first clock signal CK (FIG. 3) is inputted to the first clock terminal CK1 which is electrically connected to the drain of the transistor Q2. On the other hand, when the unit stage of the shift register is an odd-numbered stage, a second clock signal CKB (FIG. 3) is inputted to the first clock terminal CK1 electrically connected to the drain of the transistor Q2. In an exemplary embodiment, the first clock signal CK and the second clock signal CKB may have phases which are opposite to each other. In alternative exemplary embodiments, however, the first clock signal CK and the second clock signal CKB may have a phase difference such as 90 degrees or 270 degrees, for example, but alternative exemplary embodiments are not limited thereto. In an exemplary embodiment, the transistor Q2 performs a pull-up function, and the transistor Q3 performs a pull-down function.

The discharging section 140 includes a transistor Q51 and a transistor Q52. The discharging section 140 discharges a charge charged into the capacitor C1 to the first power voltage VSS through a source of the transistor Q51 in response to a second input signal IN2. The discharging section 140 discharges a charge charged into the capacitor C1 to the first power voltage VSS through a source of the transistor Q51 in response to a last scan signal GOUT_LAST.

The first holding section 150 includes transistors Q31, Q32, Q33 and Q34 and capacitors C2 and C3, and controls an on/off operation of the second holding section 160.

The second holding section 160 includes transistors Q53, Q54, Q55 and Q56, and prevents a gate node NG from floating. When the output terminal GOUT is at a high level, the second holding section 160 maintains an off-status so that the second holding section 160 performs a holding operation.

The first clock signal CK applied to the first clock terminal CK1 and the second clock signal CKB applied to the second clock terminal CK2 may have phases which are substantially inverted from each other.

Therefore, when the output terminal GOUT is at a high level, each of the transistors Q32 and Q34 performs a pull-down function and pull down a gate level of the transistor Q53 to the first power voltage VSS.

When output signal outputted from the output terminal GOUT is at a low level, a control voltage synchronized with the first clock signal CK is transferred to a gate of the transistor Q53 through the transistor Q32. The gate voltage of the transistor Q32 is less than a threshold voltage of the transistor Q31 at a high level voltage of the first clock signal CK except when the output terminal GOUT is at a high level.

Therefore, the transistor Q32 transfers the control voltage synchronized with the first clock signal CK to a gate of the transistor Q53 except when the output terminal GOUT is at a high level.

When the second clock signal CKB is at a high level, the output terminal GOUT of the shift register is at a low level, and the transistor Q56 performs a hold operation which holds the output terminal GOUT at the first power voltage VSS.

The carry section 170 includes a transistor Q6 and a capacitor C4 electrically connected to a gate and a source of the transistor Q6, and which receives the first clock signal CK through the first clock terminal CK1 electrically insulated from the output terminal GOUT. The carry section 170 provides a carry node NC of a following stage with the clock signal CK via a carry terminal CR in response to a turn-on of a Q node, e.g., a first node NQ.

Although a voltage level of the output terminal GOUT varies, the carry section 170 outputs the first clock signal CK as the carry signal. For example, even when a gate signal is not provided to a gate line due a wiring fault, for example, the carry signal is still outputted.

As shown in FIG. 1, the transistor Q3 disposed in the driving section 130 and the transistor Q51 disposed in the discharging section 140 pull down the gate node NG and a first node NQ.

Figure 2:
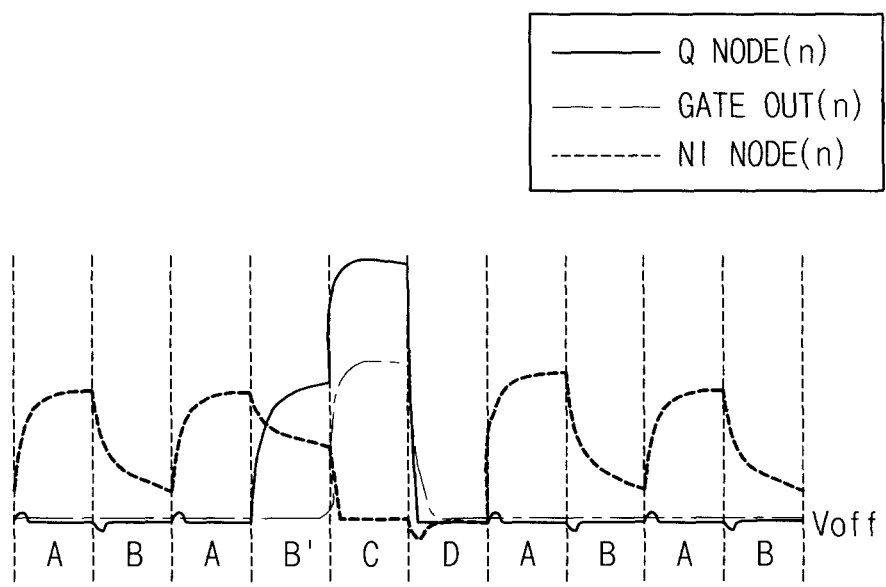
FIG. 2 is signal timing diagram illustrating an exemplary embodiment of an operation of the gate drive circuit shown in FIG. 1.

When a gate signal is outputted from a following stage, e.g., a subsequent (N+1)-th stage, the transistors Q3 and Q51 receive a gate signal outputted from the following stage as a reset signal, and shift a level of the gate node NG outputted from the following stage and a level of the first node NQ to the first power voltage VSS (e.g., to a voltage Voff, as shown in FIG. 2). However, the transistors Q3 and Q51 operate once during one frame, and the transistors Q3 and Q51 therefore do not perform an operation for reducing ripples generated during a gate off interval period in the one frame.

In an exemplary embodiment, however, the transistors Q53, Q54, Q55 and Q56 hold ripples generated during the gate off interval period. However, a threshold voltage shift may be generated in the transistors Q53, Q54, Q55 and Q56, due to a signal, such as a clock signal, continuously applied thereto.

The threshold voltage shift may reduce a current driving ability of the transistors Q53, Q54, Q55 and Q56. For example, after driving the transistors Q53, Q54, Q55 and Q56 for about 500 hours, a threshold voltage of the transistors Q53, Q54, Q55 and Q56 is shifted by a voltage of about +20V, and a current driving ability is thereby essentially eliminated.

In an exemplary embodiment, the transistor Q55 maintains a level of the first node NQ to a Voff level of the gate node NG synchronized with the clock signal CK. However, the clock signal CK may inhibit a normal boost up of a first node NQ, and a level of a gate on pulse may therefore be lowered. When driving at a low temperature, for example, a level of the gate on pulse is substantially decreased and noise may thereby be generated.

Thus, in an exemplary embodiment, the transistor Q52 of the discharging section 140, which receives a last scan signal GOUT_LAST, e.g., a frame reset signal, maintains the first node NQ to the Voff level during a blanking interval.

However, when a current driving ability of a transistor Q52 of the discharging section 140 is increased to a predetermined level, the transistors Q52 and Q55 may prevent a normal charging of the first node NQ. In addition, when a discharging TFT is disposed between the first node NQ and the first power voltage VSS, e.g., Voff, a ripple generated at a high temperature is reduced; however, a normal charging of the first node NQ is adversely affected.

FIG. 2 is a signal timing diagram illustrating an exemplary embodiment of an operation of the gate drive circuit shown in FIG. 1. More particularly, a signal at the first node NQ (e.g., the Q node) and a signal at a second node NI generated in a gate drive circuit according an exemplary embodiment are shown. In addition, in FIG. 2, GATE OUT represents a gate signal outputted through the output terminal GOUT of the unit stage 100 of a gate drive circuit according to the exemplary embodiment shown in FIG. 1.

Referring to FIGS. 1 and 2, an output of the second node NI will now be described in further detail.

During interval A, a level of the second node NI is increased to a high level synchronized with a first clock signal CK applied through the buffer section 110 (FIG. 1).

During interval B, a discharging path does not exist, and the level of a second node NI shifts to a lower level due to a current leakage.

During interval C, a gate signal outputted from a unit stage 100 (FIG. 1) is a high level, and the level of the second node NI decreases to a Voff level due to the transistor Q34 of the first holding section 150 (FIG. 1).

During interval D, the first clock signal CK is at a low level, and the level of the second node NI stays at the Voff level.

However, when an output of the second node NI, which is outputted from the first holding section 150 (FIG. 1) to perform an inverting function in a present stage, e.g., an N-th stage, is connected to a gate of a discharging transistor of the first node NQ, operational defects may be generated. For example, the transistor Q34 of the first holding section 150 (FIG. 1) is turned on during interval B (FIG. 2), and a pre-charging of the first node NQ is thereby prevented, and low temperature operational defects may therefore be generated.

Hereinafter, an exemplary embodiment of a gate drive circuit having operational reliability a high temperature and a low temperate will be described I further detail.

Figure 3:
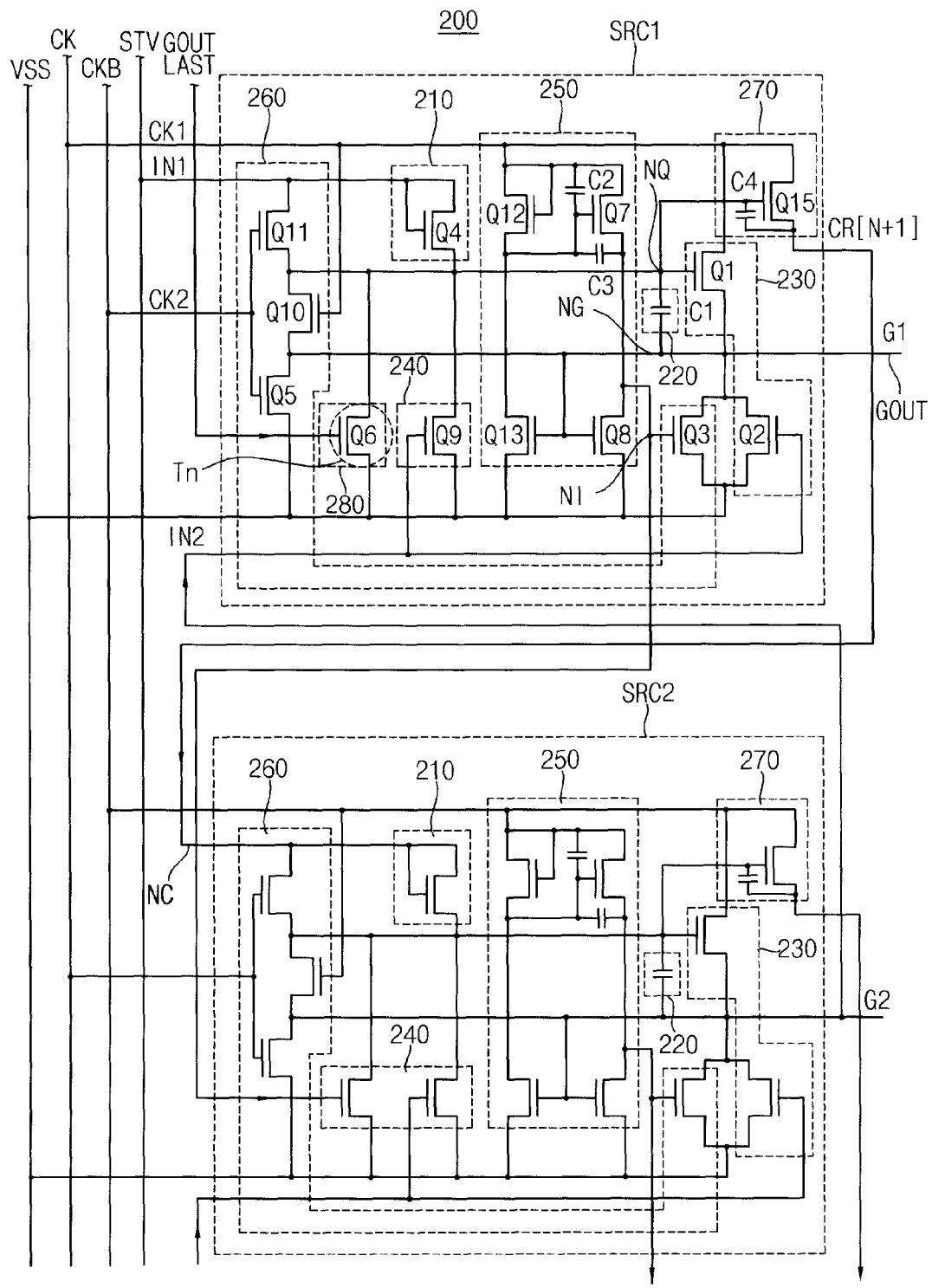
FIG. 3 is a schematic circuit diagram of an exemplary embodiment of a unit stage of a gate drive circuit according to the present invention.

FIG. 3 is a schematic circuit diagram of an exemplary embodiment of a gate drive circuit according to a second embodiment of the present invention.

Referring to FIG. 3, a shift register 200 according to an exemplary embodiment includes a present stage (e.g., a first stage) SRC1 and a following stage (e.g., a second stage) SRC2 immediately adjacent and subsequent to the present stage SRC1. For purposes of description herein, a present stage of the shift register and a following stage following the present stage are described in FIG. 3. In FIG. 3, like reference numerals identify the same or like elements between the present stage SRC1 and the following stage SRC2, and any repetitive detailed description thereof will be omitted.

The first stage SRC1 includes a buffer section 210, a charging section 220, a driving section 230, a first discharging section 240, a first holding section 250, a second holding section 260, a carry section 270 and a second discharging section 280. The stages output a scan signal (e.g., a gate signal) in response to a scan start signal STV or a carry signal outputted from a previous stage, e.g., the first stage SRC1 receives the scan start signal STV, while the second stage SRC2 receives a carry signal outputted from the first stage SRC1, as shown in FIG. 3.

The buffer section 210 includes a transistor Q4 having a drain (e.g., a first current electrode), a gate (e.g., a control electrode) and a source (e.g., a second current electrode). The drain and the gate of the transistor Q4 are commonly connected to each other, and receive a first input signal IN1. The source of the transistor Q4 is electrically connected to the charging section 220. The buffer section 210 provides the charging section 220, the driving section 230, the first discharging section 240 and the holding section 260 that are electrically connected to the source of the transistor Q4 with a carry signal provided from a previous stage. In an exemplary embodiment, the carry signal is the first input signal IN1. When the unit stage of the shift register is the first stage SRC1, however, the first input signal IN1 is the scan start signal STV, as shown in FIG. 3.

The charging section 220 includes a capacitor C1. A first terminal of the capacitor C1 is electrically connected to the source of the transistor Q4 and the discharging section 240. A second terminal of the capacitor C1 is electrically connected to an output terminal GOUT of the driving section 230. When the output terminal GOUT is in the present stage, e.g., the first stage SRC1, a first gate signal G1 is outputted through the output terminal GOUT thereof. When the output terminal GOUT is the following stage, e.g., the second stage SRC2, a second gate signal G2 outputted through the output terminal GOUT thereof.

The driving section 230 includes a transistor Q1 and a transistor Q2. A drain of the transistor Q1 is electrically connected to a first clock terminal CK1, and a gate of the transistor Q1 is electrically connected to the first terminal of the capacitor C1. A source of the transistor Q1 is electrically connected to the second terminal of the capacitor C1 and the output terminal GOUT. A drain of the transistor Q2 is electrically connected to the source of the transistor Q1 and the second terminal of the capacitor C1, and a source of the transistor Q2 is electrically connected to a first power voltage VSS. When the unit stage 100 of the shift register is an even-numbered stage, a first clock signal CK is inputted to the clock terminal CK electrically connected to the drain of the transistor Q1. On the other hand, when the unit stage of the shift register is an odd-numbered stage, a second clock signal CKB is inputted to the first clock terminal CK1 electrically connected to the drain of the transistor Q1, as shown in FIG. 3. The first clock signal CK and the second clock signal CKB have opposite phases to each other. Alternatively, the first clock signal CK and the second clock signal CKB may have a phase difference such as 90 degrees or 270 degrees, for example. In an exemplary embodiment, the transistor Q1 performs a pull-up function, and the transistor Q2 performs a pull-down function.

The first discharging section 240 includes a transistor Q9. The first discharging section 240 discharges a charge charged in the capacitor C1 to the first power voltage VSS through a source of the transistor Q9 in response to a second gate signal G2 outputted from a following stage.

As shown in FIG. 3, the transistor Q9 includes a drain electrically connected to the first terminal of the capacitor C1, a gate electrically connected to a second input signal IN2, and a source electrically connected to the first power voltage VSS. The second input signal IN2 may be a gate on signal of the following stage, for example, which acts as a reset signal.

The first holding section 250 includes transistors Q7, Q8, Q12 and Q13 and capacitors C2 and C3, and controls an on/off operation of the second holding section 260.

In an exemplary embodiment, the transistor Q12 includes a drain and a gate electrically connected to each other, and electrically connected to the first clock terminal CK1. The transistor Q7 includes a drain electrically connected to the first clock terminal CK1, a gate electrically connected to a source of the transistor Q12, and a source electrically connected to the transistor Q8. The capacitor C2 includes a first terminal electrically connected to a drain of the transistor Q7 and a second terminal electrically connected to a gate of the transistor Q7. The capacitor C3 includes a first terminal electrically connected to a gate of the transistor Q7 and a second terminal electrically connected to a source of the transistor Q7. The transistor Q13 includes a drain electrically connected to the source of the transistor Q12 and a gate of the transistor Q7, a gate electrically connected to the output terminal GOUT, and a source electrically connected to the first power voltage VSS. The transistor Q8 includes a drain electrically connected to a source of the transistor Q7 and the second holding section 260, a gate electrically connected to the output terminal GOUT, and a source electrically connected to the first power voltage VSS.

The second holding section 260 includes a plurality of transistors Q53, Q54, Q55 and Q56, and prevents the output at a gate node NG from floating. When the output terminal GOUT is at a high level, the second holding section 260 maintains an off-status so that the second holding section 260 performs a holding operation.

In an exemplary embodiment, the transistor Q3 includes a drain electrically connected to the output terminal GOUT, a gate electrically connected to the first holding section 350, and a source electrically connected to the first power voltage VSS. The transistor Q11 includes a drain electrically connected to the first input signal IN1, a gate electrically connected to the second clock terminal CK2 and a source electrically connected to the first terminal of the capacitor C1. The transistor Q10 includes a drain electrically connected to a source of the transistor Q11 and the first terminal of the capacitor C1, a gate electrically connected to the first clock terminal CK1, and a source electrically connected to the output terminal GOUT. The transistor Q5 includes a drain electrically connected to the output terminal GOUT, a gate electrically connected to the second clock terminal CK2 and the gate of the transistor Q11, and a source electrically connected to the first power voltage VSS. The first clock signal CK and the second clock signal CKB have opposite phases to each other. Alternatively, the first clock signal CK and the second clock signal CKB may have a phase difference such as 90 degrees or 270 degrees, for example.

Therefore, when the output terminal GOUT is at a high level, each of the transistors Q7 and Q8 performs a pull-down function which pulls down a gate level of the transistor Q3 to the first power voltage VSS.

When the output signal outputted from the output terminal GOUT is at a low level, a control voltage synchronized with the first clock signal CK is transferred to the gate of the transistor Q3 through the transistor Q7. A gate voltage of the transistor Q7 is less than a threshold voltage of the transistor Q12 at a high level voltage of the first clock signal CK except when the output terminal GOUT is at a high level.

Therefore, the transistor Q7 may transfer a control voltage synchronized with the first clock signal CK to the gate of the transistor Q3 except when the output terminal GOUT is at a high level.

When the second clock signal CKB is at a high level, the output terminal GOUT of the shift register is at a low level, so that the transistor Q5 performs a hold operation which holds the output terminal GOUT of the shift register to the first power voltage VSS in response to the second clock signal CKB.

The carry section 270 includes a transistor Q15 and a capacitor C4 electrically connected to a gate and a source of the transistor Q15, and receives the first clock signal CK through the first clock terminal CK1 electrically insulated from the output terminal GOUT. The carry section 270 provides a carry node NC of a following stage with the clock signal CK in response to a turn-on of the first node NQ.

Although a voltage level of the output terminal GOUT varies, the carry section 270 outputs the first clock signal CK as the carry signal.

The second discharging section 280 includes a ripple-restraining transistor Tn. The second discharging section 280 discharges electric charges charged into the capacitor C1 of the present stage to the first power voltage VSS, in response to a signal outputted from a second node NI of a previous stage.

In an exemplary embodiment, the ripple-restraining transistor Tn includes a drain connected to a first terminal of the capacitor C1, a gate connected to a second node NI of a previous stage (not shown), and a source connected to the first power voltage VSS.

In operation, the ripple-restraining transistor Tn discharges a first node NQ connected to the capacitor C1 in the present stage based on an output of a second node NI of a previous stage, in a period during which a gate off pulse is outputted after a gate on pulse is applied to the present stage. Thus, during an interval in which a gate signal is held to the first power voltage VSS, the ripple-restraining transistor Tn restrains generation of a ripple, and an operating reliability of a gate drive circuit is thereby substantially enhanced.

Figure 4:
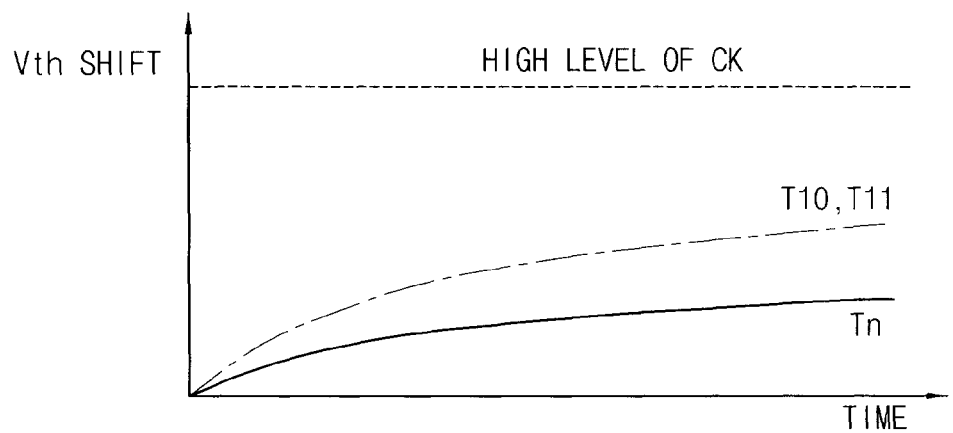
FIG. 4 is a graph of threshold voltage versus time illustrating a threshold voltage shift.

FIG. 4 is a graph of threshold voltage versus time illustrating a threshold voltage shift of the ripple-restraining transistor Tn (FIG. 3).

Referring to FIG. 4, it can be seen that a threshold voltage shift of the ripple-restraining transistor Tn of a gate drive circuit according to an exemplary embodiment of the present invention is lower than a threshold voltage shift of the transistors Q10 and Q11.

In addition, in a gate driver circuit according to an exemplary embodiment, the transistors Q10 and Q11 are directly connected to a clock signal, via the second clock terminal CK2. However, the ripple-restraining transistor Tn is connected to a second node NI of a previous stage, as shown in FIG. 3.

Accordingly, in an exemplary embodiment, the ripple-restraining transistor Tn maintains a current driving ability, and generation of a ripple is effectively prevented at the first node NQ.

Figure 5:
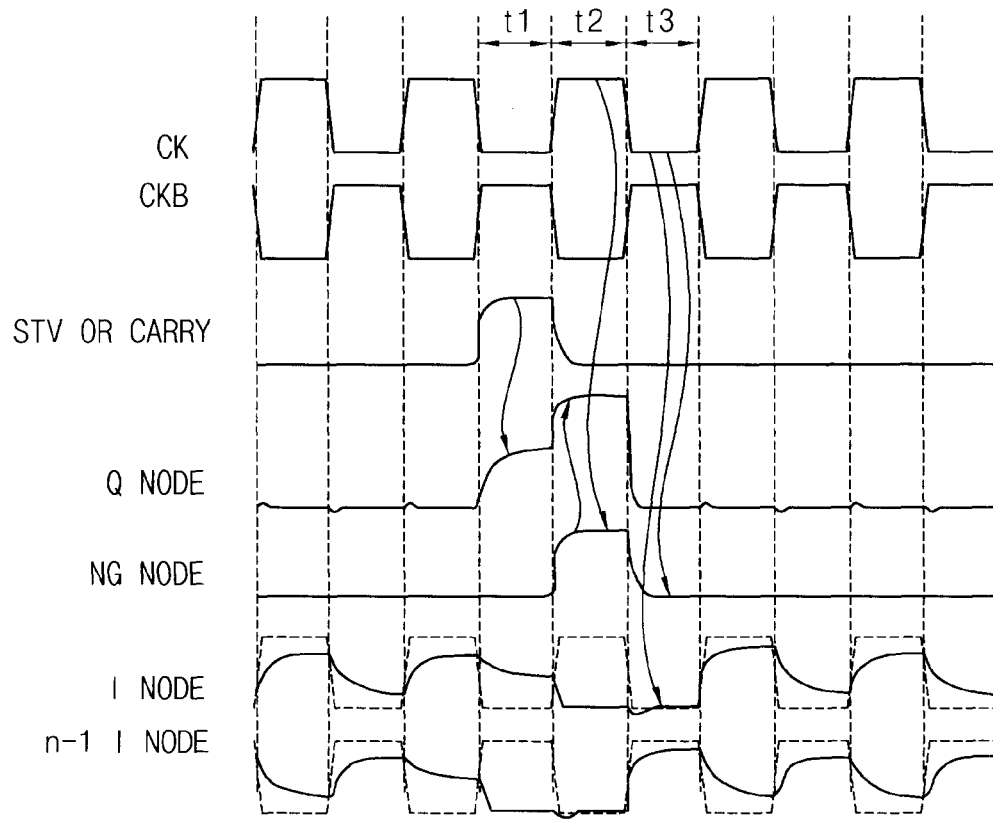
FIG. 5 is signal timing diagram illustrating exemplary embodiments of input signals and output signals of a shift register of the gate drive circuit shown in FIG. 3.

FIG. 5 is a signal timing diagram illustrating input signals and output signals of an exemplary embodiment of the shift register shown in FIG. 3.

Referring to FIGS. 3 and 5, a first clock signal CK and a second clock signal CKB alternate between a high level and a low level. The first node NQ charges to a high level due to a carry signal provided from a previous stage during an interval t1.

Then, the high level of the first clock signal CK is outputted to the first node NQ as a gate on pulse through the transistor Q1 performing a pull-up function. In an exemplary embodiment, a boosting up further increases a level of the first node NQ during an interval t2.

When the first clock signal CK changes to a low level, levels of the first node NQ and the gate node NG drop to Voff during an interval t3. Then, when the first clock signal CK changes, a ripple is generated due to parasitic capacitance of the transistor Q1 at the first node NQ. However, the ripple generated by the parasitic capacitor is substantially reduced and/or effectively prevented by the transistors Q10 and Q11.

In FIG. 5, a waveform labeled "I NODE" is a second node NI waveform corresponding to a present stage, and a waveform labeled "n−1 I NODE" is a second node NI waveform corresponding to a previous stage.

In a gate drive circuit according to an exemplary embodiment, a gate of a ripple-restraining transistor Tn is connected to a second node NI of a previous stage to restrain a generation of a ripple at a first node NQ.

When a gate of the ripple-restraining transistor Tn is connected to the second node NI of the present stage, generation of a ripple is effectively restrained at the first node NQ. However, during interval t1, when the gate of the ripple-restraining transistor Tn is connected to the second node NI of the present stage, the ripple-restraining transistor Tn is turned on. Therefore, a charging of a first node NQ is blocked, and a current driving ability of a transistor Q1 at a low temperature is decreased.

However, when the gate of the ripple-restraining transistor Tn is connected to the second node NI of the previous stage, the gate of the ripple-restraining transistor Tn is maintained at Voff during intervals t1 and t2, during which the first node NQ charges, and a charging of the first node NQ is not restrained in an exemplary embodiment.

Moreover, while the first node NQ is maintained at the voltage Voff, a gate of the ripple-restraining transistor Tn has a continuous voltage level, and generation of a ripple is effectively restrained at the first node NQ.

Figure 6:
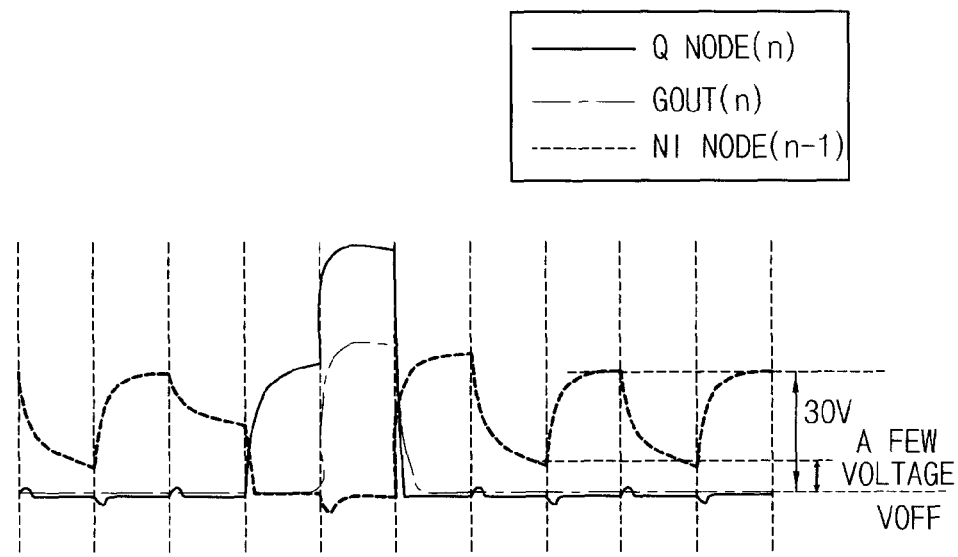
FIG. 6 is signal timing diagram illustrating an exemplary embodiment of a waveform at a first node and a second node of the shift register of the gate drive circuit shown in FIG. 3.

FIG. 6 is a signal timing diagram illustrating a waveform at the first node NQ and the second node NI of the shift register shown in FIG. 3.

Referring to FIG. 6, a charging time of a first node NQ, e.g., a Q Node, of a present stage corresponds to a low level of a second node NI of a previous stage. Thus, a holding capability of the first node NQ is secured without interruption of the charging time of the first node NQ.

A gate drive circuit according to an alternative exemplary embodiment of the present invention will now be described in further detail.

An operating time of a gate drive circuit according to an exemplary embodiment includes an operating time of a hold transistor of a gate drive circuit.

Specifically, a gate of a ripple-restraining transistor Tn in accordance with an exemplary embodiment is connected to a second node NI of a previous stage, and an operation of the ripple-restraining transistor Tn is synchronized with a second clock signal CKB. A gate-source voltage Vgs of a transistor Q3 connected to a second node NI of a previous stage is a maximum of about 30 V, as shown in FIG. 6.

In addition, different voltage levels of the gate-source voltage Vgs are applied during a timing of a first clock signal CK, and a ripple holding capability is thereby maintained. Thus, generation of a ripple is effectively restrained by applying a first clock signal CK and a second clock signal CKB.

Moreover, a function of the transistors Q54, Q55 and Q52 of the gate drive circuit according to an exemplary embodiment (FIG. 2) is performed by the ripple-restraining transistor Tn in a gate drive circuit according to a an alternative exemplary embodiment (FIG. 6). Thus, a required size of the transistors Q10 and Q11 is substantially reduced and/or is effectively minimized in an exemplary embodiment. In addition, the transistor Q52 of a gate drive circuit according to an alternative exemplary embodiment may be omitted.

In addition, a threshold voltage shift is low in a gate drive circuit according to an exemplary embodiment, and a reliability of the gate drive circuit is thereby substantially improved, even when the gate drive circuit is driven for a long time, as will now be described in further detail.

In the gate drive circuit shown in FIG. 3, the transistors Q11, Q10 and Q5 are directly connected to the second clock signal CKB. Thus, a threshold voltage shifting amount is increased, and a current driving ability thereof would be expected to decrease.

However, the ripple-restraining transistor Tn of the gate drive circuit shown in FIG. 3 is connected to a second node NI of a previous stage. Thus, a threshold voltage shift of the ripple-restraining transistor Tn is less than a threshold voltage shift of the transistors Q11, Q10 and Q5 by about 60% to about 70%, as described in further detail below with reference to FIG. 7. Accordingly, a decrease in a ripple holding capability with age is less for the ripple-restraining transistor Tn.

Figure 7:
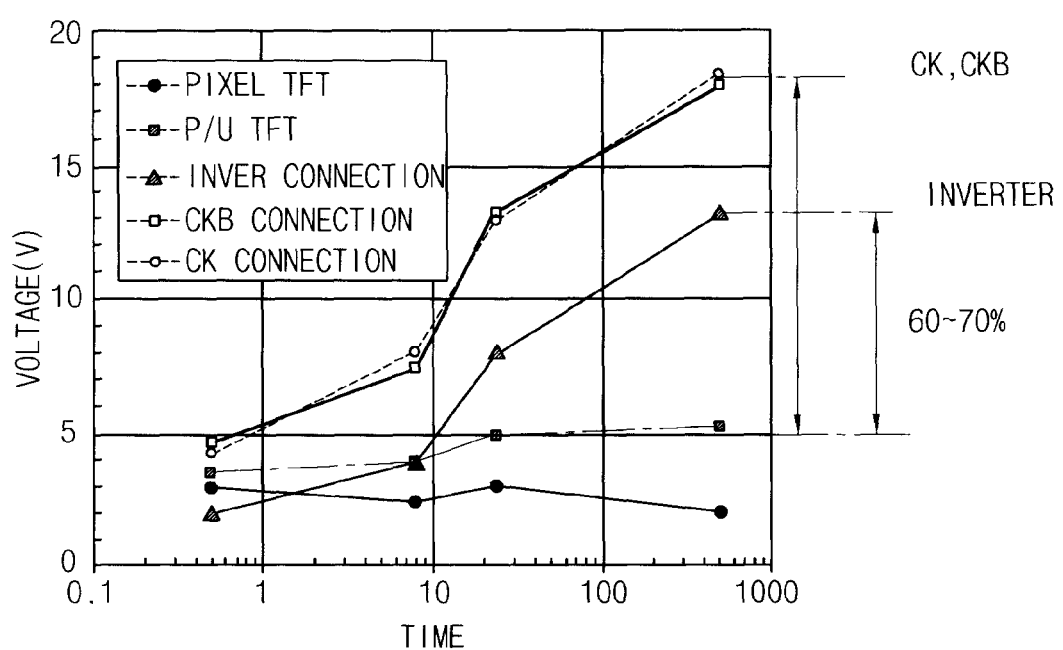
FIG. 7 is a graph of voltage versus time illustrating a threshold voltage shift measuring value in a thin-film transistor ("TFT")

FIG. 7 is a graph of voltage versus time illustrating a threshold voltage shift.

Referring to FIG. 7, a threshold voltage shift value of the ripple-restraining transistor Tn connected to a second node NI is about 60% to about 70% of a threshold voltage shift value of the transistors Q11, Q10 and Q5 directly connected to a first clock signal CK or a second clock signal CKB. Thus, the ripple-restraining transistor Tn maintains a current driving ability longer than the transistors Q11, Q10 and Q5.

A reason for the relatively small threshold voltage shift of the ripple-restraining transistor Tn is that the ripple-restraining transistor Tn receives a relatively small stress due to a threshold voltage of the transistors Q7, Q8, Q12 and Q13 of the first holding section 150 inverting a high level of a clock signal. Thus, since the transistor Q7 of the previous stage buffers the first clock signal CK and/or the second clock signal CKB, a bias stress on the ripple-restraining transistor Tn of a present stage is substantially decreased.

Figure 8A:
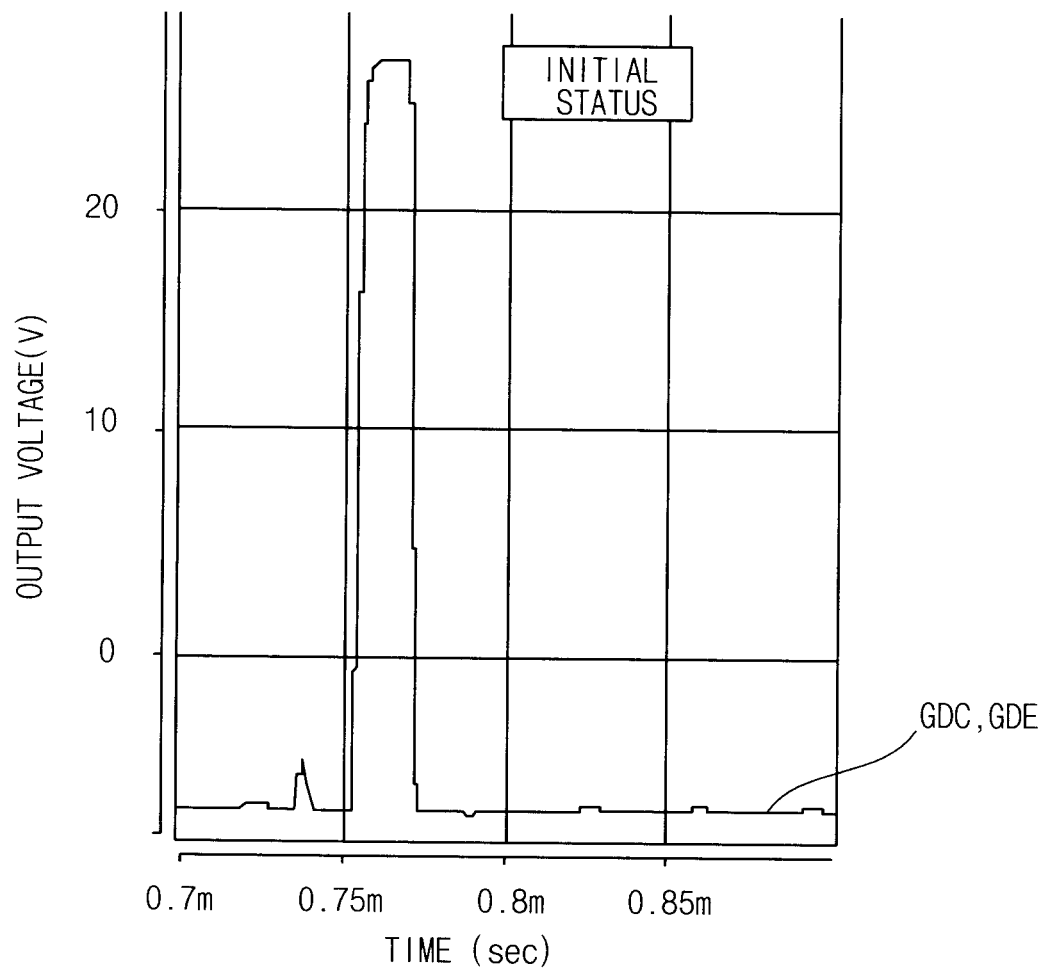
FIGS. 8A and 8B are signal timing diagram of exemplary embodiments of a waveform of the gate drive circuit shown in FIG. 1 and a simulation waveform of the gate drive circuit shown in FIG. 3.
Figure 8B:
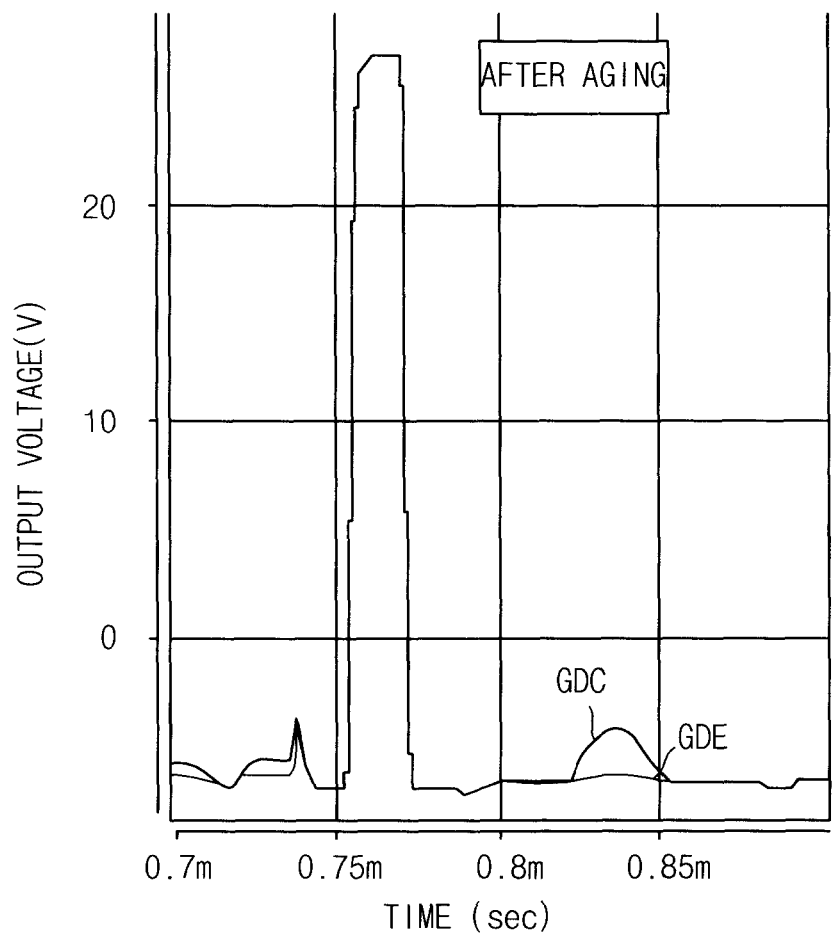

FIGS. 8A and 8B are signal timing diagrams for comparing a simulation waveform of an exemplary embodiment of the gate drive circuit shown FIG. 1 with a simulation waveform of an exemplary embodiment the gate drive circuit shown in FIG. 3.

Referring to FIG. 8A, in an initial status, a gate signal outputted from a gate drive circuit GDC according to an exemplary embodiment described above with reference to FIG. 1 is substantially equal to a gate signal outputted from a gate drive circuit GDE according to an alternative exemplary embodiment described above with reference to FIG. 3.

Referring to FIG. 8B, the gate signal outputted from the gate drive circuit GDC according to the exemplary embodiment described above with reference to FIG. 1 after aging (e.g., after which a predetermined time has lapsed) includes a ripple.

However, in the gate signal outputted from the gate drive circuit GDE according to the exemplary embodiment described above with reference to FIG. 3, a ripple is not generated.

Figure 9A:
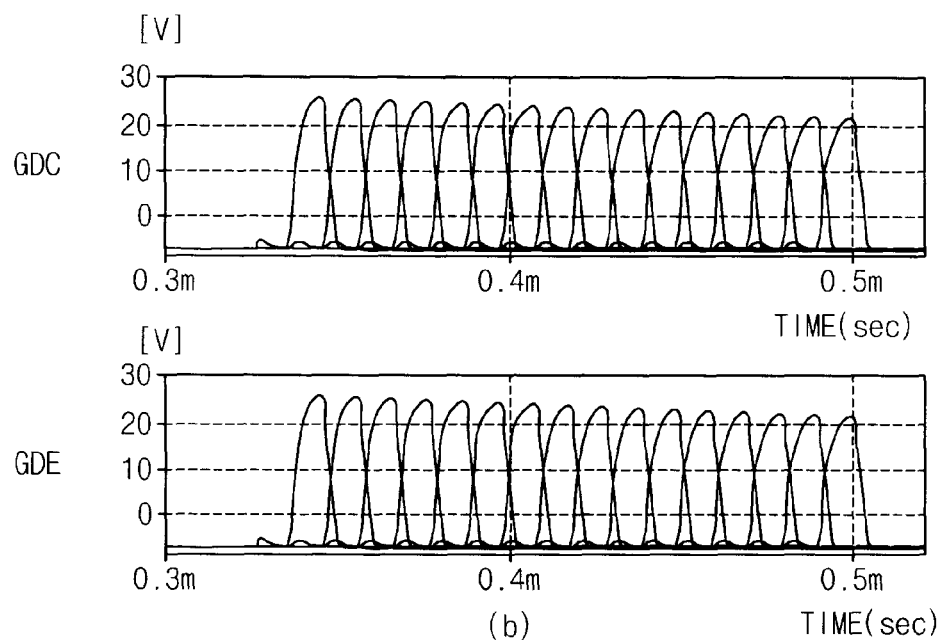
FIG. 9A is signal timing diagram illustrating a simulation waveform of an output of an exemplary embodiment of a gate drive circuit driven at a low temperature and a high frequency.
Figure 9B:
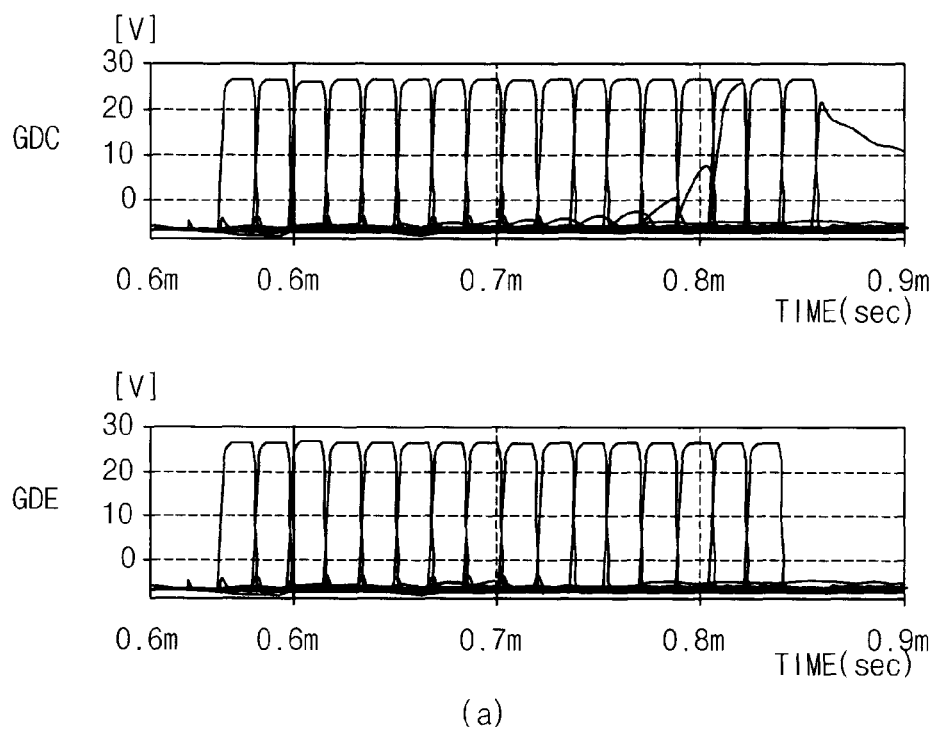
FIG. 9B is signal timing diagram illustrating a simulation waveform of an output of an exemplary embodiment of a gate drive circuit driven at a high temperature and a low frequency.

FIG. 9A is a signal timing diagram illustrating a simulation waveform of an output of an exemplary embodiment of a gate drive circuit driven at a low temperature and high frequency. FIG. 9B is a signal timing diagram illustrating a simulation waveform of an output of an exemplary embodiment of a gate drive circuit driven at a high temperature and low frequency.

Simulations were performed at a high temperature/low frequency and a low temperature/high frequency, respectively. In addition, a threshold voltage shift value at a high temperature was 28.5 V and an operating frequency at a low temperature was about 78 Hz.

Referring to FIG. 9A, at the low temperature/high frequency, the gate drive circuit GDC according to the exemplary embodiment described above with reference to FIG. 1. operates normally. In addition, the gate drive circuit GDE according to the exemplary embodiment described above with reference to FIG. 3 normally operated, as well.

Referring to FIG. 9B, at the high temperature/low frequency, a ripple was generated in a gate signal outputted from the gate drive circuit GDC of the exemplary embodiment described above with reference to FIG. 1, and a malfunction is generated. However, a ripple is not generated in a gate signal outputted from the gate drive circuit according to the exemplary embodiment described above with reference to FIG. 3.

Therefore, at a high temperature, the gate drive circuit GDE of the exemplary embodiment described above with reference to FIG. 3 has a further enhanced ripple restraining capability in comparison with the exemplary embodiment of the gate drive circuit GDC of the exemplary embodiment described above with reference to FIG. 1.

Figure 10:
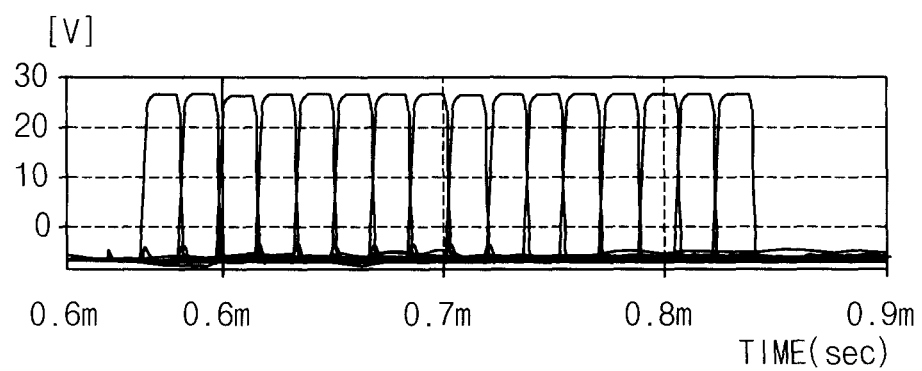
FIG. 10 is a signal timing diagram illustrating a simulation result of an alternative exemplary embodiment of the gate drive circuit according to the present invention.

FIG. 10 is a signal timing diagram illustrating a simulation result of an exemplary embodiment of the gate drive circuit according the present invention. Particularly, a simulation program with integrated circuit emphasis ("SPICE") simulation result is illustrated, and was performed at a high temperature/low frequency status after the transistor Q10 was removed from the gate drive circuit GDE (as described above and illustrated in FIG. 3).

Referring to FIG. 10, the gate drive circuit according to the exemplary embodiment described above with reference to FIG. 1 operated normally even though the transistors Q55 and Q52 are removed from the gate drive circuit GDE in the exemplary embodiment described above with reference to FIG. 3.

Put another way, the ripple-restraining transistor Tn added to the gate drive circuit GDE according to the exemplary embodiment described above with reference to FIG. 3 includes an operating time of the transistors Q55 and Q52 of the gate drive circuit according to an exemplary embodiment, and it is thereby verified that a reliability of an operation is secured at a high temperature/low frequency driving status even though corresponding transistors Q55 and Q52 are removed.

Additionally, the transistor Q55 restrains a ripple at a high temperature operation; however, the transistor Q55 decreases a charging capability at a low temperature operation. Thus, when a size of the transistor Q55 is minimized or removed, a reliability of the gate drive circuit may be increased for low temperature operation.

Figure 11:
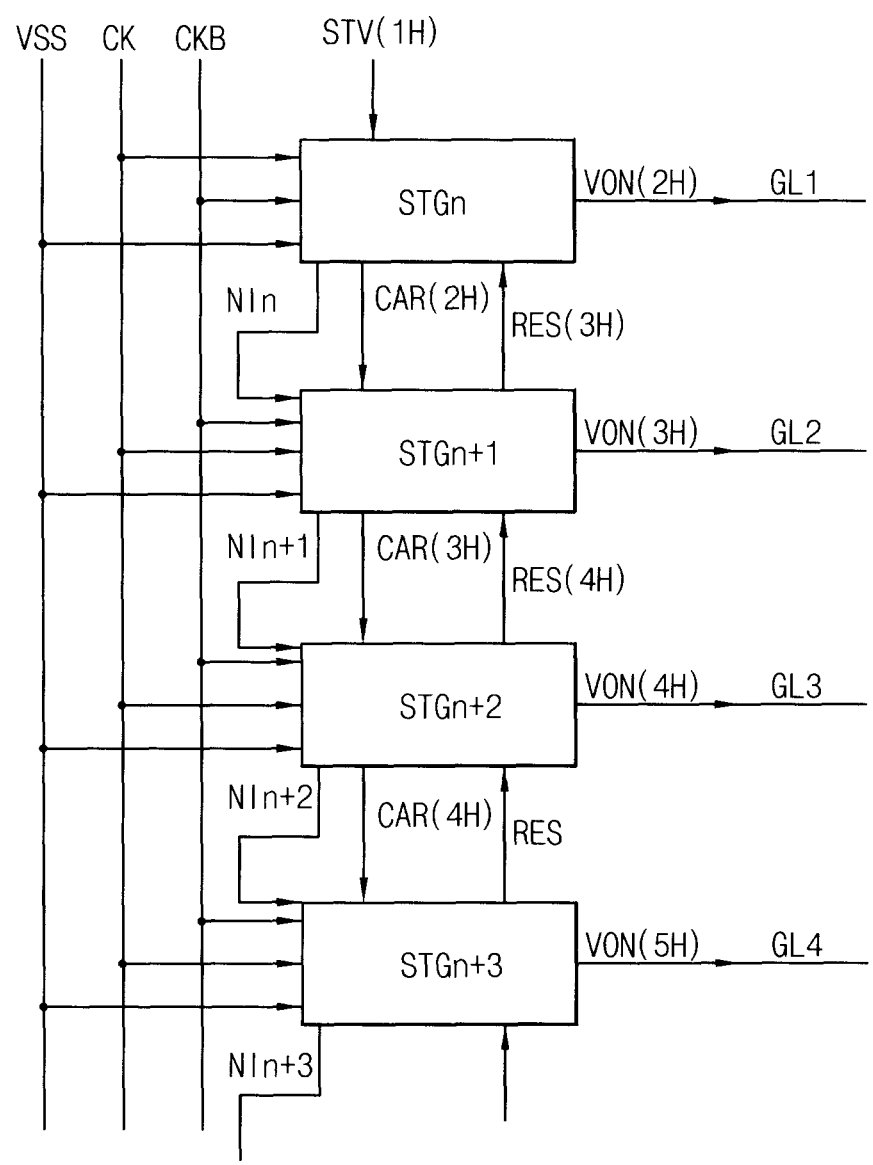
FIG. 11 is a block diagram of an exemplary embodiment of the gate drive circuit shown in FIG. 3.

FIG. 11 is a block diagram of an exemplary embodiment of the gate drive circuit shown in FIG. 3. In FIG. 11, a gate drive circuit 300 of a single amorphous silicon gate ("ASG") structure will be illustrated.

A power line which transmits a first power voltage VSS, a first clock signal line transmitting a first clock signal CK, and a second clock signal line transmitting a second clock signal CKB having a substantially inverted phase with respect to a phase of the first clock signal CK are disposed in the gate drive circuit 300 having the double ASG structure.

In a gate drive circuit 300, a second node NI of an n-th stage STGn is connected to a first node NQ disposed in an (n+1)-th stage STGn+1. Herein, "n" is a natural number.

Referring to FIGS. 3 and 11, when a scan start signal STV is supplied to the n-th stage STGn during a 1H time interval (e.g., a time interval in which the first gate line GL1 I activated), a first node NQ of the n-th stage STGn is charged. The 1H time interval is defined by Equation 1.

$$1H = \left(\frac{1}{f}\right) * \left(\frac{1}{\text{a number of gate lines}}\right) \quad \text{Equation 1}$$

For example, when a driving frequency f and a resolution are 60 Hz and XGA (1024×768), respectively, a time of 1H is calculated as 1/60*1/768=21.7 μs.

A gate on signal VON and a second carry signal CAR are simultaneously outputted to the first gate line GL1 in a 2H time interval, and the first node NQ of the (n+1)-th stage STGn+1 is charged.

Then, a gate on signal VON, a third carry signal CAR and a reset signal RES are simultaneously outputted to the second gate line GL2 in a 3H time interval, a first node NQ of the (n+2)-th stage STGn+2 is charged, and a first node NQ of the n-th stage STGn and the first gate line GL1 are simultaneously reset.

Then, a gate on signal VON, a fourth carry signal CAR and a reset signal RES are simultaneously outputted to the third gate line GL3 in a 4H time interval, a first node NQ of the (n+3)-th stage STGn+3 is charged, and a first node NQ of the (n+1)-th stage STGn+1 and the second gate line GL2 are simultaneously reset.

Figure 12:
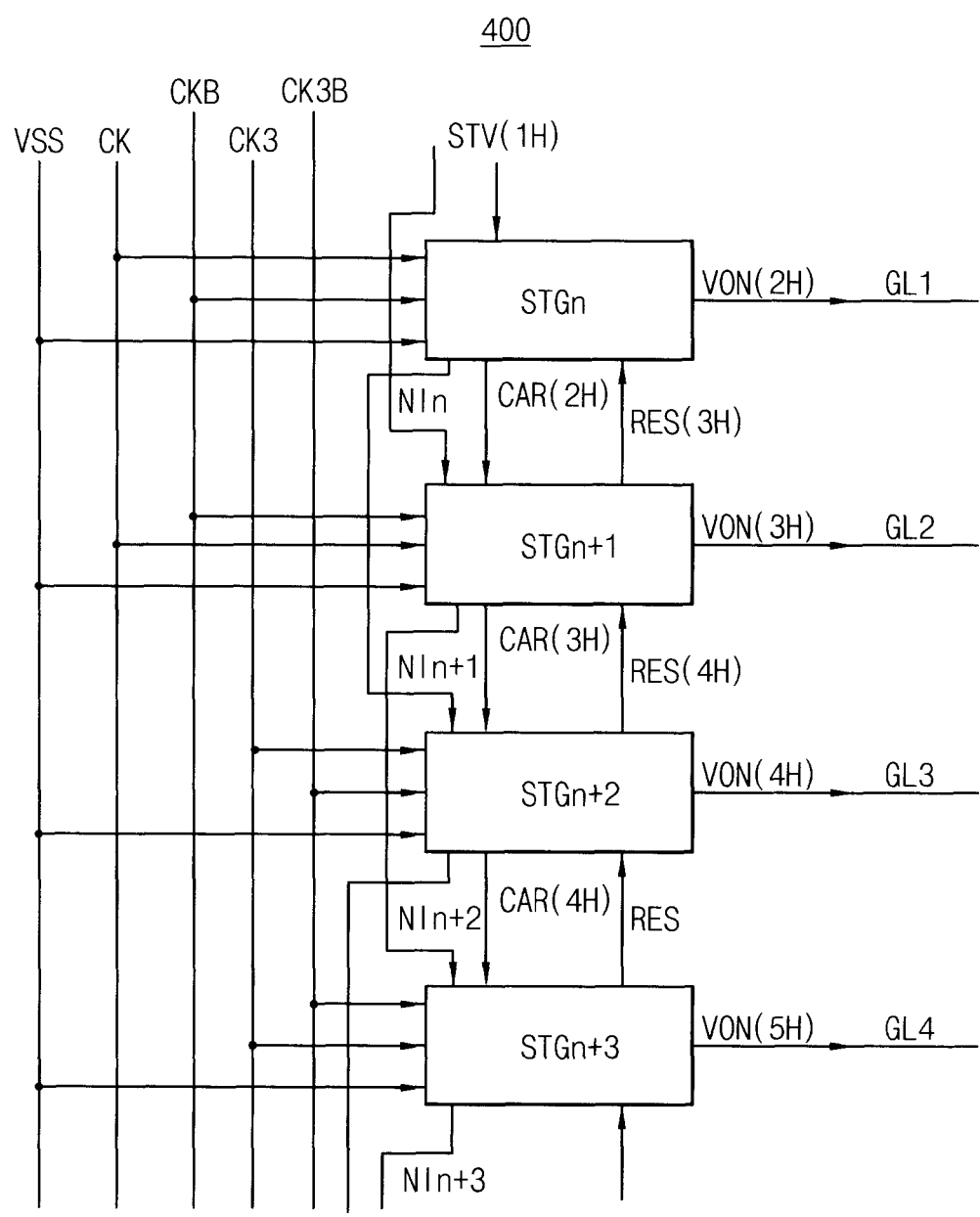
FIG. 12 is a block diagram of an alternative exemplary embodiment of the gate drive circuit shown in FIG. 3.

FIG. 12 is a block diagram of an alternative exemplary embodiment of the gate drive circuit shown in FIG. 3. In FIG. 12, a gate drive circuit 400 having a double ASG structure is illustrated.

A power line which transmits a first power voltage VSS, a first clock signal line which transmits the first clock signal CK, and a second clock signal line which transmits a second clock signal CKB having a substantially inverted phase with respect to a phase of the first clock signal CK1 are disposed in the gate drive circuit 400 having the double ASG structure. Moreover, a third clock signal line which transmits a third clock signal CK3, and a fourth clock signal line which transmits a fourth clock signal CK3B having a substantially inverted phase with respect to a phase of the third clock signal CK3 are disposed in the gate drive circuit 400 having the double ASG structure.

Thus, as shown in FIG. 12, a gate drive circuit in which a second node NI of an n-th stage STGn is connected to a first node NQ disposed in a (n+2)-th stage STGn+2 is illustrated.

Figure 13:
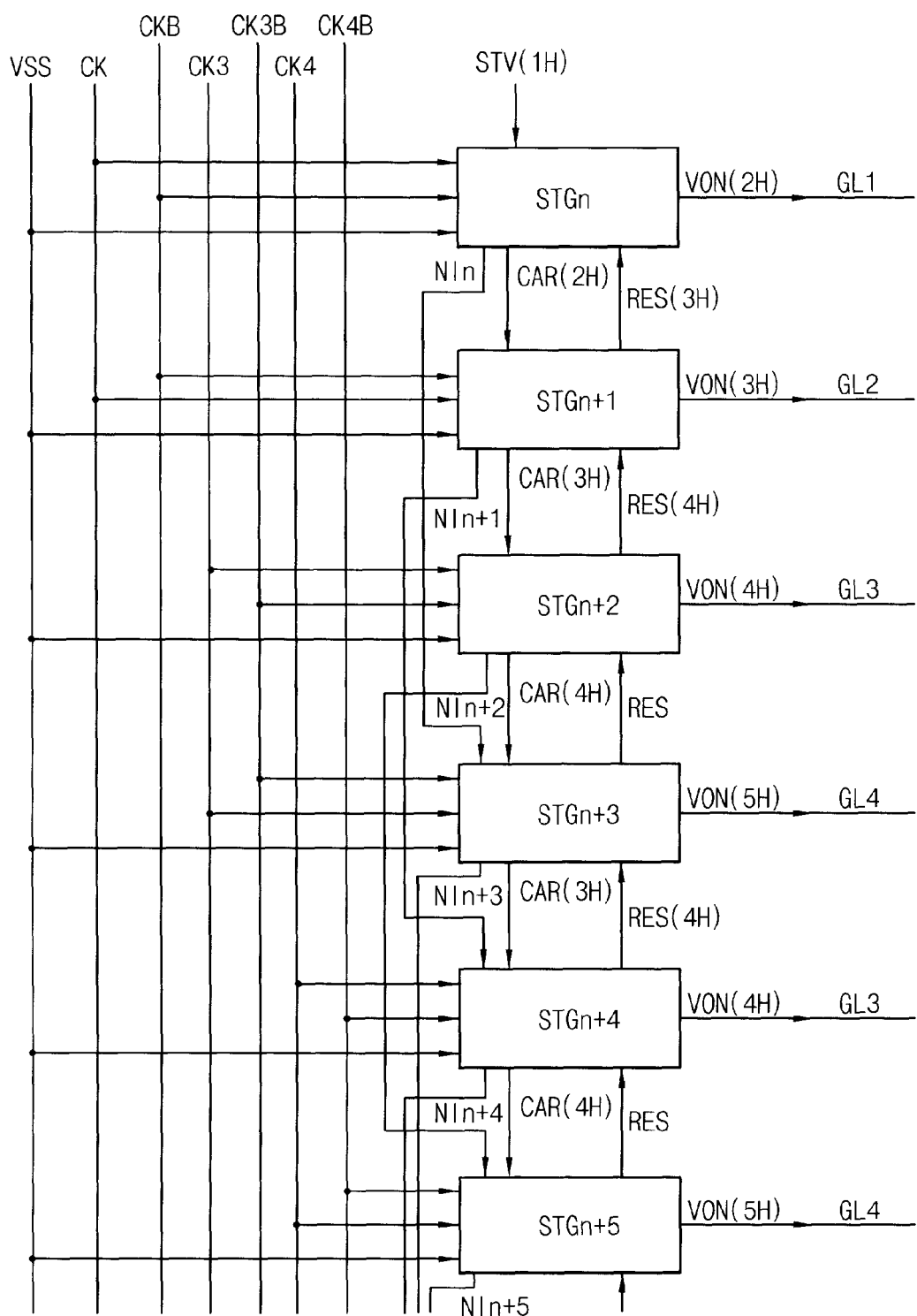
FIG. 13 is a block diagram of another alternative exemplary embodiment of the gate drive circuit shown FIG. 3.

FIG. 13 is a block diagram of another alternative exemplary embodiment of the gate drive circuit shown in FIG. 3. In FIG. 13, a gate drive circuit 500 having a triple ASG structure is illustrated.

A power line which transmits a first power voltage VSS, a first clock signal line which transmits the first clock signal CK, and a second clock signal line which transmits a second clock signal CKB having a substantially inverted phase with respect to a phase of the first clock signal CK are disposed in the gate drive circuit 500 having the triple ASG structure. Moreover, a third clock signal line transmitting a third clock signal CK3, a fourth clock signal line which transmits a fourth clock signal CK3B having a substantially inverted phase respect to a phase of with the third clock signal CK3 are disposed in the gate drive circuit 500 having the triple ASG structure. Furthermore, a fifth clock signal line which transmits a fifth clock signal CK4, and a sixth clock signal line which transmits a sixth clock signal CK4B having a substantially inverted phase with respect to a phase of the fifth clock signal CK4 are disposed in the gate drive circuit 500 having the triple ASG structure.

Thus, as shown in FIG. 13, a gate drive circuit in which a second node NI of an n-th stage STGn is connected to a first node NQ disposed in a (n+3)-th stage STGn+3 is illustrated.

Figure 14:
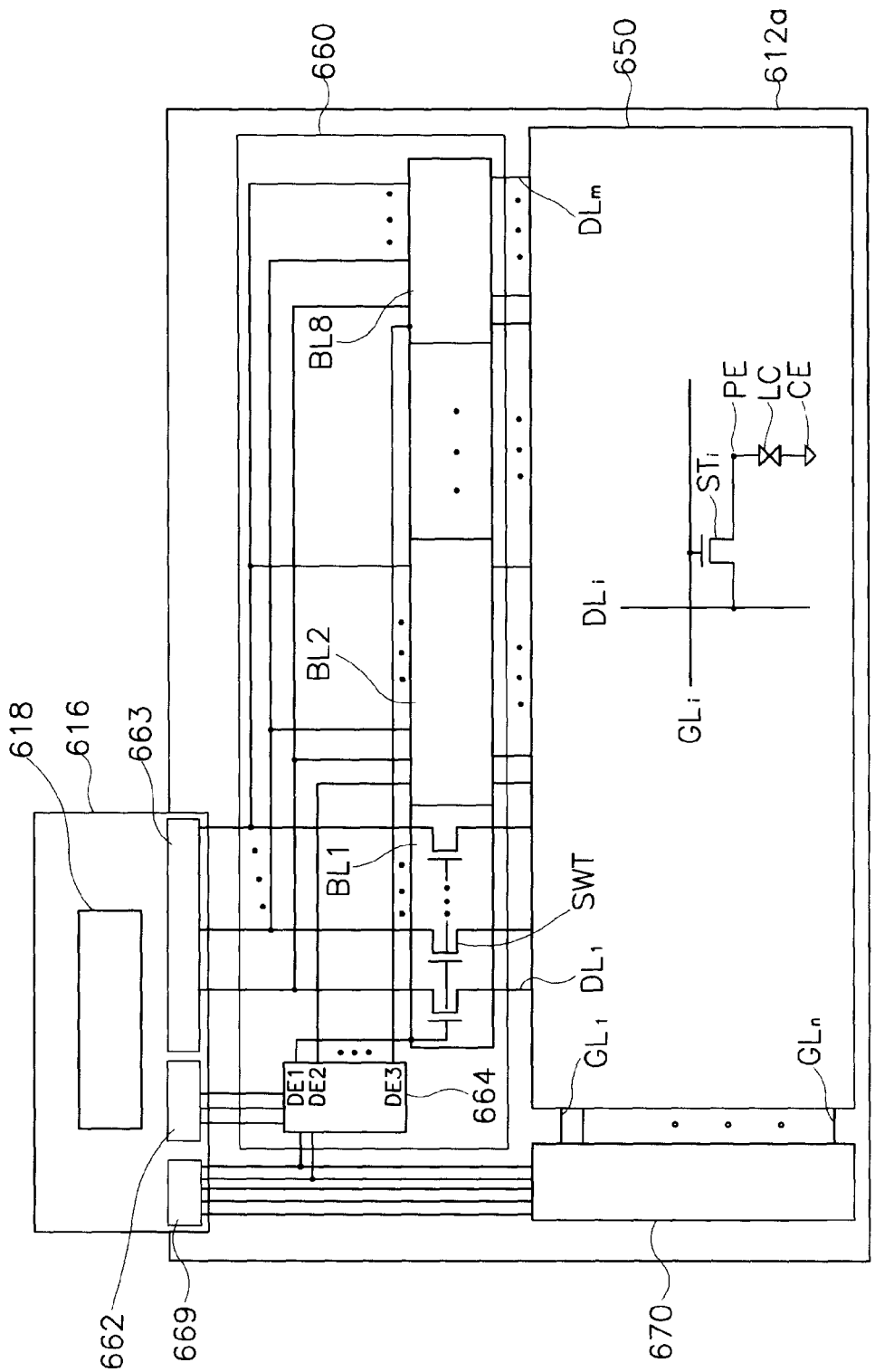
FIG. 14 is a plan view of an exemplary embodiment of a display apparatus according to the present invention.

FIG. 14 is a plan view illustrating an exemplary embodiment of a display apparatus according to the present invention.

Referring to FIG. 14, a display cell array 650, a data driver circuit 660, a gate drive circuit 670, external connection terminals 662 and 663 for connecting the data driver circuit 660 to an integrated control chip (not shown) and another external connection terminal 669 for connecting the gate drive circuit 670 to the integrated control chip are formed on a thin film transistor ("TFT") substrate 612a in a same process in which the TFTs are formed on the TFT substrate 612a. In FIG. 14, a reference numeral "616" may represent a flexible printed circuit board, and a reference numeral "618" may represent a timing controller.

The display cell array 650 includes m data lines DL1, DL2, . . . , DLm (where "m" is a natural number) and n gate lines GL1, GL2, . . . , GLn (where "n" is a natural number). The data lines DL1, DL2, . . . , DLm extend in a substantially column direction, and the gate lines GL1, GL2, . . . , GLn extend in a substantially row direction substantially perpendicular to the data lines DL1, DL2, . . . , DLm.

Switching transistors STi are disposed at intersection between corresponding data lines DL1, DL2, . . . , DLm and gate lines GL1, GL2, . . . , GLn. A drain of the switching transistor STi is connected to a data line DLi, a gate of the switching transistor STi is connected to a gate line GLi (where "i" is a natural number), and a source of the switching transistor STi is connected to a pixel electrode PE. A liquid crystal LC is disposed between the pixel electrode PE and a common electrode CE. The switching transistor STi and the pixel electrode PE define a pixel part.

A voltage applied to the pixel electrode PE and the common electrode CE changes an alignment angle of liquid crystal molecules I nth liquid crystal LC, and an amount of the light passing through the liquid crystal molecules are thereby regulated, and an image is displayed.

The data driver circuit 660 according to an exemplary embodiment includes a shift register 664 and switching transistors SWT. In an exemplary embodiment, each of 8 data line blocks BL1, BL2, . . . , BL8 includes 200 of the switching transistors SWT.

Thus, 200 input terminals of each of the data line blocks BL1 . . . BL8 are commonly connected to the external connection terminal 663, and 200 output terminals are connected to the 200 corresponding data lines. The external connection terminal 163 has 200 data input terminals. A block selection terminal is connected to an output terminal of the shift register 664.

Sources of the switching transistors SWT are connected to the corresponding data lines DL, drains of the switching transistors SWT are connected to the corresponding data input terminals, respectively, and gates of the switching transistors SWT are connected to the block selection terminal. In an exemplary embodiment, the switching transistors SWT are amorphous silicon TFT metal oxide semiconductor ("a-Si TFT MOS") transistors.

Accordingly, 1600 data lines are divided into 8 blocks of 200 data lines, and 8 block selection signals thereby sequentially select each of the 8 blocks.

The shift register 664 receives a first clock signal, a second clock signal and a block selection start signal through the external connection terminal 662 having three terminals. Each of the output terminals of the shift register 664 is connected to the block selection terminal of the corresponding data line block.

The gate drive circuit 670 may include a plurality of stages, as described above in greater detail. For example, the gate drive circuit 730 may be a gate drive circuit of a single ASG structure as described above with reference to FIG. 11. Alternatively, the gate drive circuit 730 may be a gate drive circuit of a double ASG structure described above with reference to FIG. 12. Instill another alternative exemplary embodiment, the gate drive circuit 730 may be a gate drive circuit of a triple ASG structure described above with reference to FIG. 13.

As shown in FIG. 14, the gate drive circuit 670 is disposed corresponding to a latitudinal side of the TFT substrate 612a, and the data drive circuit 600 is disposed corresponding to a longitudinal side of the TFT substrate 612a. Alternatively, the gate drive circuit 670 may be disposed along the longitudinal side of the TFT substrate 612a, and the data drive circuit 660 may be dispose along the latitudinal side of the TFT substrate 612a. Here, the m data lines DL1-DLm extend in a substantially row direction along the latitudinal side of TFT substrate 612a, and the n gate lines GL1-GLn extend in a substantially column direction along the along the longitudinal side of the TFT substrate 612a.

As described herein, according to exemplary embodiments of present invention, a first node corresponding to a capacitor of a present stage is discharged based on an output of a second node of a previous stage, during an interval during which a gate off pulse is outputted after a gate on pulse is applied to the present stage. Thus, during an interval in which the gate signal is held to a first power voltage, generation of a ripple is substantially reduced and/or effectively prevented, and a reliability of an operation of a gate drive circuit outputting a gate signal and a reliability of an operation of a liquid crystal display device in which the gate drive circuit is incorporated are substantially enhanced.

The present invention should not be construed as being limited to the exemplary embodiments set forth herein. Rather, these exemplary embodiments are provided so that this disclosure will be thorough and complete and will fully convey the concept of the present invention to those skilled in the art.

While the present invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A gate drive circuit including cascaded stages, the cascaded stages including a first stage to which a scan start signal is provided to an input terminal thereof, a stage of the cascaded stages comprising:
   a charging section which charges one of the scan start signal and a carry signal provided from a previous stage to a first node;
   a driving section connected to the charging section at the first node, the driving section configured to pull up a high level of a first clock signal to output a gate signal through a gate node and an output terminal as the first node is charged to a high level;
   a first discharging section which discharges voltage potentials of the first node and the gate node to hold the voltage potentials of the first node and the gate node at a first power voltage as the first clock signal is shifted to a low level;
   a first holding section that transfers a control voltage synchronized with the first clock signal to a second holding section through a second node of the present stage when the output terminal is at a low level, the second holding section including a transistor having a gate connected to the second node, the second holding section being configured to hold the gate signal with the first power voltage in response to a second clock signal; and
   a second discharging section which receives a voltage potential signal of a second node of the previous stage, which connects a first holding section to a second holding section in the previous stage, to reduce ripples generated at the first node, wherein the second discharging section includes a ripple-restraining transistor comprising a source connected to the first power voltage, a drain connected to the first node, and a gate connected to the second node of the previous stage.

2. The gate drive circuit of claim 1, wherein the gate of the ripple-restraining transistor maintains the first power voltage during a charging time of the first node to reduce the ripples generated at the first node.

3. The gate drive circuit of claim 1, wherein when the second discharging section is in an n-th stage (where n is a natural number), the previous stage is an (n–1)-th stage.

4. The gate drive circuit of claim 3, further comprising:
   a first clock signal line which transmits the first clock signal; and
   a second clock signal line which transmits the second clock signal having a phase which is substantially inverted from a phase of the first clock signal.

5. The gate drive circuit of claim 1, wherein when the second discharging section is in an n-th stage (where n is a natural number), the previous stage is an (n–2)-th stage.

6. The gate drive circuit of claim 5, further comprising:
   a first clock signal line which transmits the first clock signal;
   a second clock signal line which transmits the second clock signal having a phase which is substantially inverted from a phase of the first clock signal;
   a third clock signal line which transmits a third clock signal; and a fourth clock signal line which transmits a fourth clock signal having a phase which is substantially inverted from a phase of the third clock signal.

7. The gate drive circuit of claim 1, wherein when the second discharging section is in an n-th stage (where n is a natural number), the previous stage is an (n−3)-th stage.

8. The gate drive circuit of claim 7, further comprising:
a first clock signal line which transmits the first clock signal;
a second clock signal line which transmits the second clock signal having a phase which is substantially inverted from a phase of the first clock signal;
a third clock signal line which transmits a third clock signal;
a fourth clock signal line which transmits a fourth clock signal having a phase which is substantially inverted from a phase of the third clock signal;
a fifth clock signal line which transmits a fifth clock signal; and
a sixth clock signal line which transmits a sixth clock signal having a phase which is substantially inverted from a phase of the fifth clock signal.

9. A display apparatus comprising:
a display panel comprising pixel parts connected to gate lines and data lines crossing the gate lines;
a data drive circuit which provides the data lines with a data voltage; and
a gate drive circuit including cascaded stages,
wherein a stage of the cascaded stages comprises:
a charging section which charges one of a scan start signal and a carry signal provided from a previous stage to a first node;
a driving section connected to the charging section at the first node, the driving section configured to pull up a high level of a first clock signal to output a gate signal through a gate node and an output terminal as the first node is charged to a high level;
a first discharging section which discharges voltage potentials of the first node and the gate node to hold the voltage potentials of the first node and the gate node to a first power voltage as the first clock signal is shifted to a low level;
a first holding section that transfers a control voltage synchronized with the first clock signal to a second holding section through a second node of the present stage when the output terminal is at a low level, the second holding section including a transistor having a gate connected to the second node, the second holding section being configured to hold the gate signal with the first power voltage in response to a second clock signal; and
a second discharging section which receives a voltage potential signal of a second node of the previous stage, which connects a first holding section to a second holding section in the previous stage, to reduce ripple components generated at the first node, wherein the second discharging section includes a ripple-restraining transistor comprising a source connected to the first power voltage, a drain connected to the first node, and a gate connected to the second node of the previous stage.

10. The display apparatus of claim 9, wherein
when the second discharging section is in an n-th stage (where n is a natural number), the previous stage is an (n−1)-th stage, and
the gate drive circuit further comprises:
a first clock signal line which transmits the first clock signal; and
a second clock signal line which transmits the second clock signal having a phase which is substantially inverted from a phase of the first clock signal.

11. The display apparatus of claim 9, wherein
when the second discharging section is in an n-th stage (where n is a natural number), the previous stage is an (n−2)-th stage, and
the gate drive circuit further comprises:
a first clock signal line which transmits the first clock signal;
the second clock signal line which transmits a second clock signal having a phase which is substantially inverted from a phase of the first clock signal;
a third clock signal line which transmits a third clock signal; and
a fourth clock signal line which transmits a fourth clock signal having a phase which is substantially inverted from a phase of the third clock signal.

12. The display apparatus of claim 9, wherein
when the second discharging section is in an n-th stage (where n is a natural number), the previous stage is an (n−3)-th stage, and the gate drive circuit further comprises:
a first clock signal line which transmits the first clock signal;
a second clock signal line which transmits the second clock signal having a phase which is substantially inverted from a phase of the first clock signal;
a third clock signal line which transmits a third clock signal;
a fourth clock signal line which transmits a fourth clock signal having a phase which is substantially inverted from a phase of the third clock signal;
a fifth clock signal line which transmits a fifth clock signal; and
a sixth clock signal line which transmits a sixth clock signal having a phase which is substantially inverted from a phase of the fifth clock signal.

\* \* \* \* \*